United States Patent
Lin et al.

(10) Patent No.: US 11,027,967 B2
(45) Date of Patent: Jun. 8, 2021

(54) DEFORMABLE MEMBRANE AND A COMPENSATING STRUCTURE THEREOF

(71) Applicant: InvenSense, Inc., San Jose, CA (US)

(72) Inventors: Chung-Hsien Lin, Hsinchu (TW);
Joseph Seeger, Menlo Park, CA (US);
Calin Miclaus, Fremont, CA (US);
Tsung Lin Tang, Hsinchu (TW);
Pei-Wen Yen, Hsinchu (TW)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/108,858

(22) Filed: Aug. 22, 2018

(65) Prior Publication Data
US 2019/0345024 A1    Nov. 14, 2019

Related U.S. Application Data

(60) Provisional application No. 62/655,139, filed on Apr. 9, 2018.

(51) Int. Cl.
*B81B 3/00*    (2006.01)
*B81C 1/00*    (2006.01)

(52) U.S. Cl.
CPC ........ *B81B 3/0078* (2013.01); *B81C 1/00182* (2013.01); *B81B 2201/0235* (2013.01);
(Continued)

(58) Field of Classification Search
CPC ........ B81C 1/00182; B81B 2201/0242; B81B 3/0078; B81B 2201/0235;
(Continued)

(56) References Cited

U.S. PATENT DOCUMENTS

| 5,889,212 A | 3/1999 | Guthrie et al. |
| 6,148,673 A | 11/2000 | Brown |

(Continued)

FOREIGN PATENT DOCUMENTS

| CN | 103597330 | 12/2011 |
| EP | 2717030 A1 | 9/2014 |

(Continued)

OTHER PUBLICATIONS

English Translation of the 1st Office Action and Search Report dated Aug. 31, 2020 for TW Patent Application No. 108112200. 16 pages.

(Continued)

*Primary Examiner* — Su C Kim

(57) ABSTRACT

A sensor includes a substrate, an electrode, a deformable membrane, and a compensating structure. The substrate includes a first side and a second side. The first side is opposite to the second side. The substrate comprises a cavity on the first side. The electrode is positioned at a bottom of the cavity on the first side of the substrate. The deformable membrane is positioned on the first side of the substrate. The deformable membrane encloses the cavity and deforms responsive to external stimuli. The compensation structure is connected to outer periphery of the deformable membrane. The compensation structure creates a bending force that is opposite to a bending force of the deformable membrane responsive to temperature changes and thermal coefficient mismatch.

27 Claims, 19 Drawing Sheets

(52) U.S. Cl.
CPC .......... *B81B 2201/0242* (2013.01); *B81B 2201/0264* (2013.01); *B81B 2201/0292* (2013.01)

(58) Field of Classification Search
CPC ............ B81B 2201/0292; G01L 19/04; G01L 9/0045; G01L 9/0048; G01L 9/0072
See application file for complete search history.

(56) References Cited

U.S. PATENT DOCUMENTS

| | | | |
|---|---|---|---|
| 6,205,861 | B1 | 3/2001 | Lee |
| 6,564,642 | B1 | 5/2003 | Clifford |
| 7,516,667 | B2 | 4/2009 | Ueno |
| 8,230,743 | B2 | 7/2012 | Wade et al. |
| 9,190,352 | B2 | 11/2015 | Tiu et al. |
| 9,638,597 | B2 | 5/2017 | Hooper et al. |
| 2006/0229045 | A1* | 10/2006 | Choi .................. H01H 59/0009 455/252.1 |
| 2007/0180916 | A1* | 8/2007 | Tian ...................... B06B 1/0292 73/649 |
| 2008/0038590 | A1* | 2/2008 | Nakakubo ............. G01N 27/16 429/468 |
| 2008/0308917 | A1 | 12/2008 | Pressel et al. |
| 2009/0026560 | A1 | 1/2009 | Wombacher et al. |
| 2009/0065916 | A1 | 3/2009 | Crane et al. |
| 2011/0316101 | A1* | 12/2011 | Dang .................. B81C 1/00365 257/418 |
| 2014/0374848 | A1 | 12/2014 | Koh et al. |
| 2016/0079293 | A1 | 3/2016 | Ishii et al. |
| 2017/0165715 | A1* | 6/2017 | Sudol .................. B06B 1/0292 |
| 2018/0114804 | A1 | 4/2018 | Hsieh |
| 2019/0206752 | A1 | 7/2019 | Bautista, Jr. et al. |

FOREIGN PATENT DOCUMENTS

| | | |
|---|---|---|
| TW | I420988 B | 12/2013 |
| TW | 201435320 A | 9/2014 |
| TW | 201522915 | 6/2015 |
| TW | I494812 B | 8/2015 |
| WO | 02/14821 A2 | 2/2002 |
| WO | 2018007641 A1 | 1/2018 |

OTHER PUBLICATIONS

Notification Concerning Transmittal of International Preliminary Report of Patentability (Chapter 1 of the Patent Cooperation Treaty) dated Oct. 22, 2020 PCT Application No. PCT/US2019/026309 8 pages.

* cited by examiner

DEFORMABLE MEMBRANE AND A COMPENSATING STRUCTURE THEREOF

BACKGROUND

MEMS ("micro-electro-mechanical systems") are a class of devices that are fabricated using semiconductor-like processes. Electrodes on MEMS devices are usually made of non-silicon material. A deformable membrane may be used for sensing in MEMS devices. Unfortunately, deformable membranes in MEMS devices are sensitive to temperature changes and may bend in response to temperature changes and due to thermal coefficient mismatch. Calibrating the sensor output at different temperatures may be used in order to compensate for the bending of the deformable membrane at different temperatures. Unfortunately, calibrating the sensor at different temperatures is time consuming, power intensive, and fails to cover a wide range of temperatures. Furthermore, calibrating the sensor output at different temperatures does not calibrate and account for drift that occurs over time.

SUMMARY

Accordingly, there is a need to address the bending of the deformable membrane in response to temperature changes and to compensate for the offset created. In some embodiments, a compensating structure is used on an outer periphery of the deformable membrane that applies a force opposite to that of the deformable membrane in response to temperature changes.

In some embodiments, a sensor includes a substrate, an electrode, a deformable membrane, and a compensating structure. The substrate includes a first side and a second side. The first side is opposite to the second side. The substrate comprises a cavity on the first side. The electrode is positioned at a bottom of the cavity on the first side of the substrate. The deformable membrane is positioned on the first side of the substrate. The deformable membrane encloses the cavity and deforms responsive to external stimuli. The compensation structure is connected to the deformable membrane. The compensation structure creates a bending force that is opposite to a bending force of the deformable membrane responsive to temperature changes and thermal coefficient mismatch.

These and other features and advantages will be apparent from a reading of the following detailed description.

DESCRIPTION

Figure 1A:
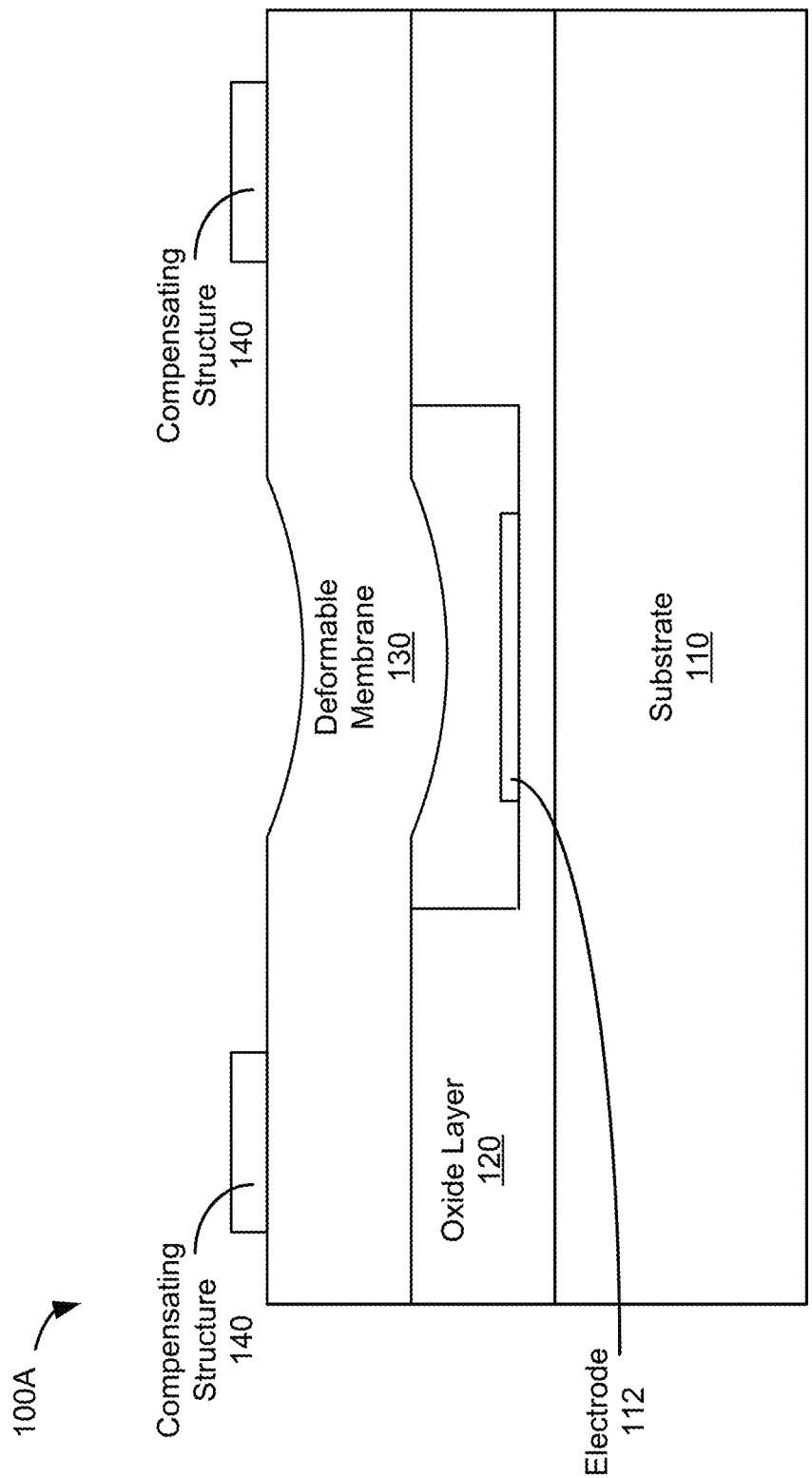
FIGS. 1A-1H show MEMS devices according to some embodiments.
Figure 1B:
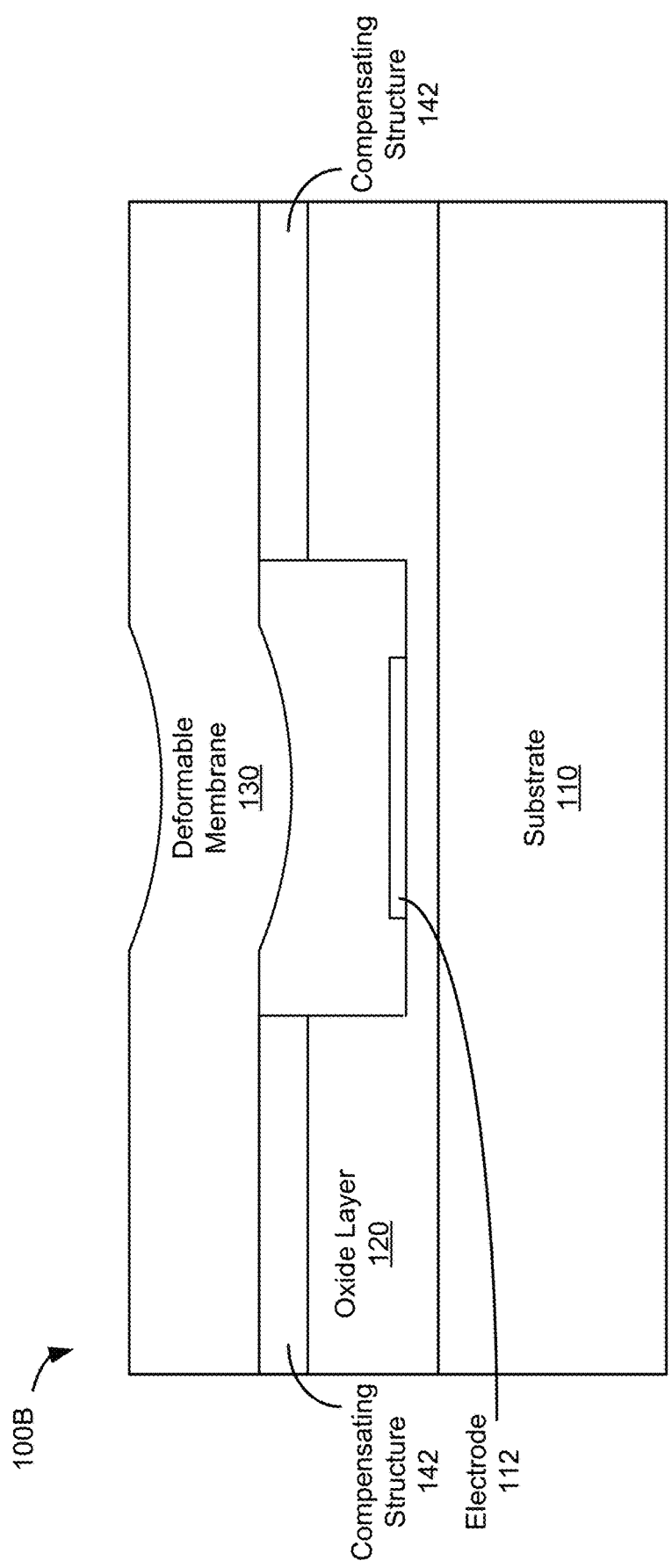
Figure 1C:
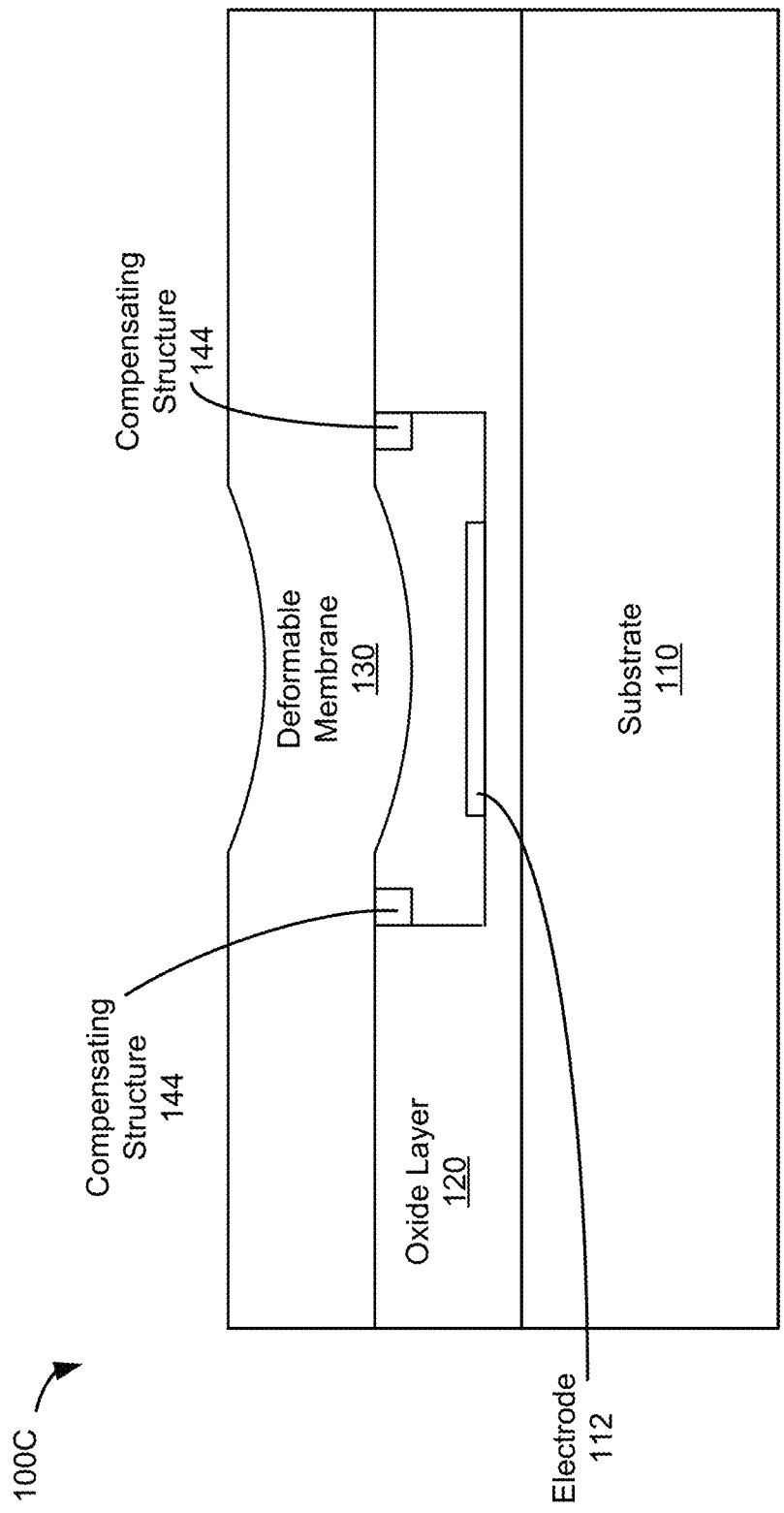

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A micro-electro-mechanical systems ("MEMS") device includes mechanical elements and may optionally include electronics (e.g. electronics for sensing). MEMS devices include but are not limited to, for example, gyroscopes, accelerometers, magnetometers, pressure sensors, etc. A deformable membrane may be used for sensing in MEMS devices. Unfortunately, deformable membranes in MEMS devices are sensitive to temperature changes and may bend in response to temperature changes and due to thermal coefficient mismatch. Calibrating the sensor output at different temperatures may be used in order to compensate for the bending of the deformable membrane at different temperatures. Unfortunately, calibrating the sensor at different temperatures is time consuming, power intensive, and fails to cover a wide range of temperatures. Furthermore, calibrating the sensor output at different temperatures does not calibrate and account for drift that occurs over time.

Accordingly, there is a need to address the bending of the deformable membrane in response to temperature changes and to compensate for the offset created. In some embodiments, a compensating structure is formed on, e.g., outer periphery as one example, the deformable membrane that applies a force opposite to that of the deformable membrane in response to temperature changes. It is appreciated that in some embodiments, the compensating structure may also relax the initial stress associated with the used material.

FIGS. 1A-1H show MEMS devices according to some embodiments. Referring specifically to FIG. 1A, a sensor 100A according to some embodiments is shown. The sensor 100A includes a substrate 110, an oxide layer 120, a deformable membrane 130, and a compensating structure 140. It is appreciated that the substrate 110 may be a silicon substrate. The oxide layer 120, e.g., SiO$_2$, may be deposited on the substrate 110. In some embodiments, the deformable membrane 130 is formed over the oxide layer 120 in order to form a cavity therein. In some embodiments, an electrode 112 may be formed over the oxide layer 120 and at the bottom of the cavity. The deformable membrane 130 may be formed from a silicon substrate that moves in response to external stimuli, e.g., pressure, acceleration, etc. It is appreciated that in some embodiments, an electrode may be formed within and/or over the deformable membrane 130 or integrated therein. Thus, the capacitance of the capacitor formed by the electrode 112 and the electrode of the deformable membrane 130 changes as the deformable membrane 130 bends in response to external stimuli.

A mismatch between thermal coefficients of material used, e.g., material used for the deformable membrane 130 and the substrate 130, etc. may cause the deformable membrane 130 to bend at varying temperatures. According to some embodiments, the compensating structure 140 may be formed on the deformable membrane 130, e.g., outer periphery in one example, in order to compensate and address the bending of the deformable membrane 130 at varying temperatures. The compensating structure 140 may include material such as aluminum, copper, dielectric, polysilicon, Ti, Tungsten, Platinum, molybdenum, silicon, nitride, etc. and it may be formed on the deformable membrane 130, e.g., outer periphery of the deformable membrane 130 as one example.

The compensating structure 140 may apply a force that is opposite to the force that causes the deformable membrane 130 to bend in response to varying temperatures. In other words, if the deformable membrane 130 bends downward at a given temperature due to the temperature, the compensating structure 140 applies an upward force to the deformable membrane 130 in order to undo the downward force. Similarly, if the deformable membrane 130 bends upward at a given temperature due to the temperature, the compensating structure 140 applies a downward force to the deformable membrane 130 in order to undo the upward force. It is appreciated that the thickness of the compensating structure 140 may be chosen depending on the material of deformable membrane 130, the substrate 110, and their respective dimensions. Moreover, it is appreciated that the compensating structure 140 may be any shape, e.g., ring shaped, ring shaped with gaps in between, square shaped, square shaped with gaps in between, etc.

It is appreciated that the compensating structure 140 may be formed on a different plane than the electrode 112. For example, the compensating structure 142 may be formed in between the deformable membrane 130 and the oxide layer 120, as shown by sensor 100B of FIG. 1B. In some embodiments, the compensating structure 144 may be formed such that it is positioned to be physically in contact with the deformable membrane 130 and the oxide layer 120 but not in between, as shown by sensor 100C in FIG. 1C.

Figure 1D:
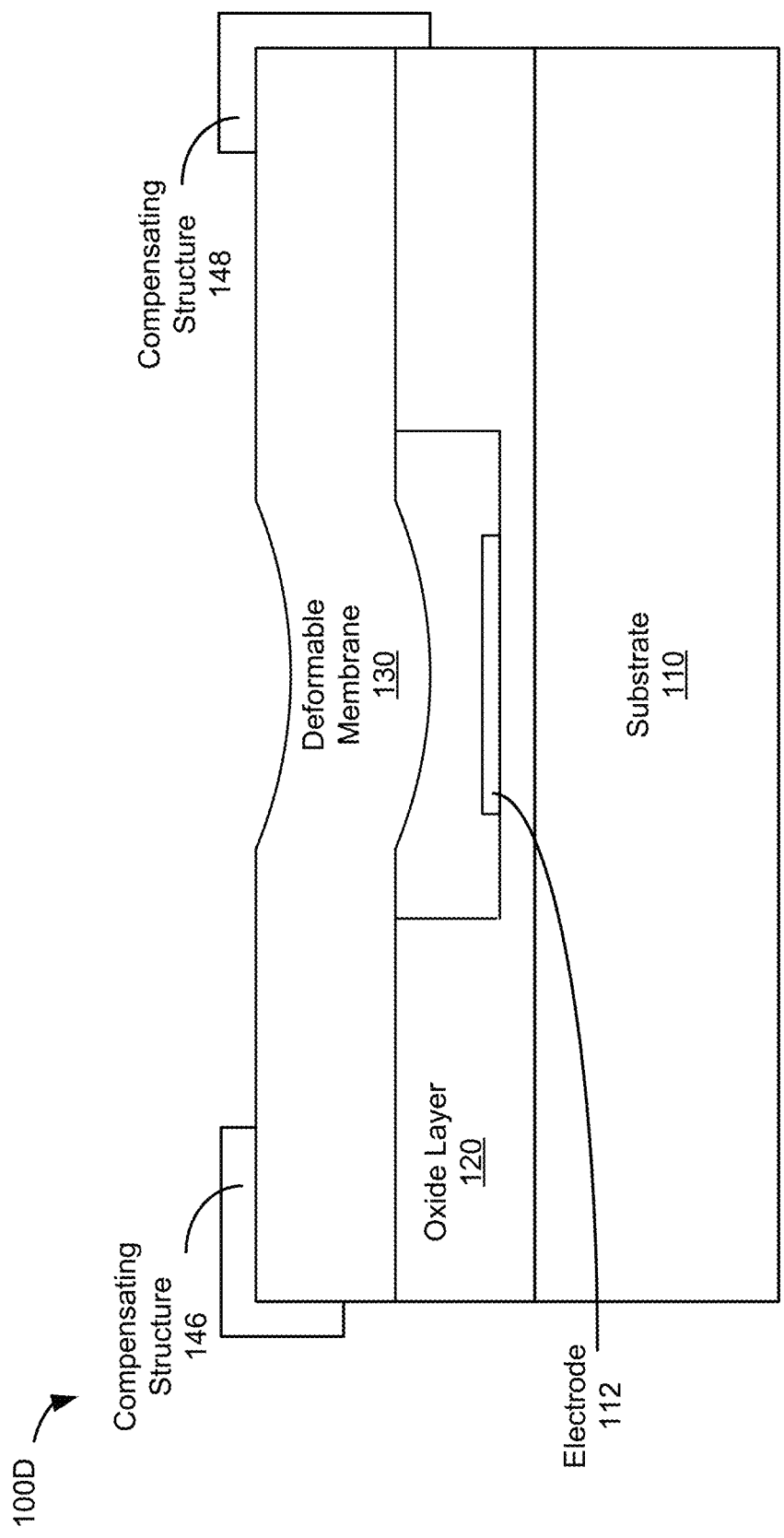

Referring now to FIG. 1D, compensating structures 146 and 148 of a sensor 100D according to some embodiments are shown. As illustrated, the compensating structure 146 may be formed on the outer periphery and upper surface of the deformable membrane 130 as well as a portion of the outer side wall of the deformable membrane 130. In contrast, the compensating structure 148 may be formed on the outer periphery and upper surface of the deformable membrane as well as the outer side wall of the deformable membrane 130 and a portion of the outer side wall of the oxide layer 120.

Figure 1E:
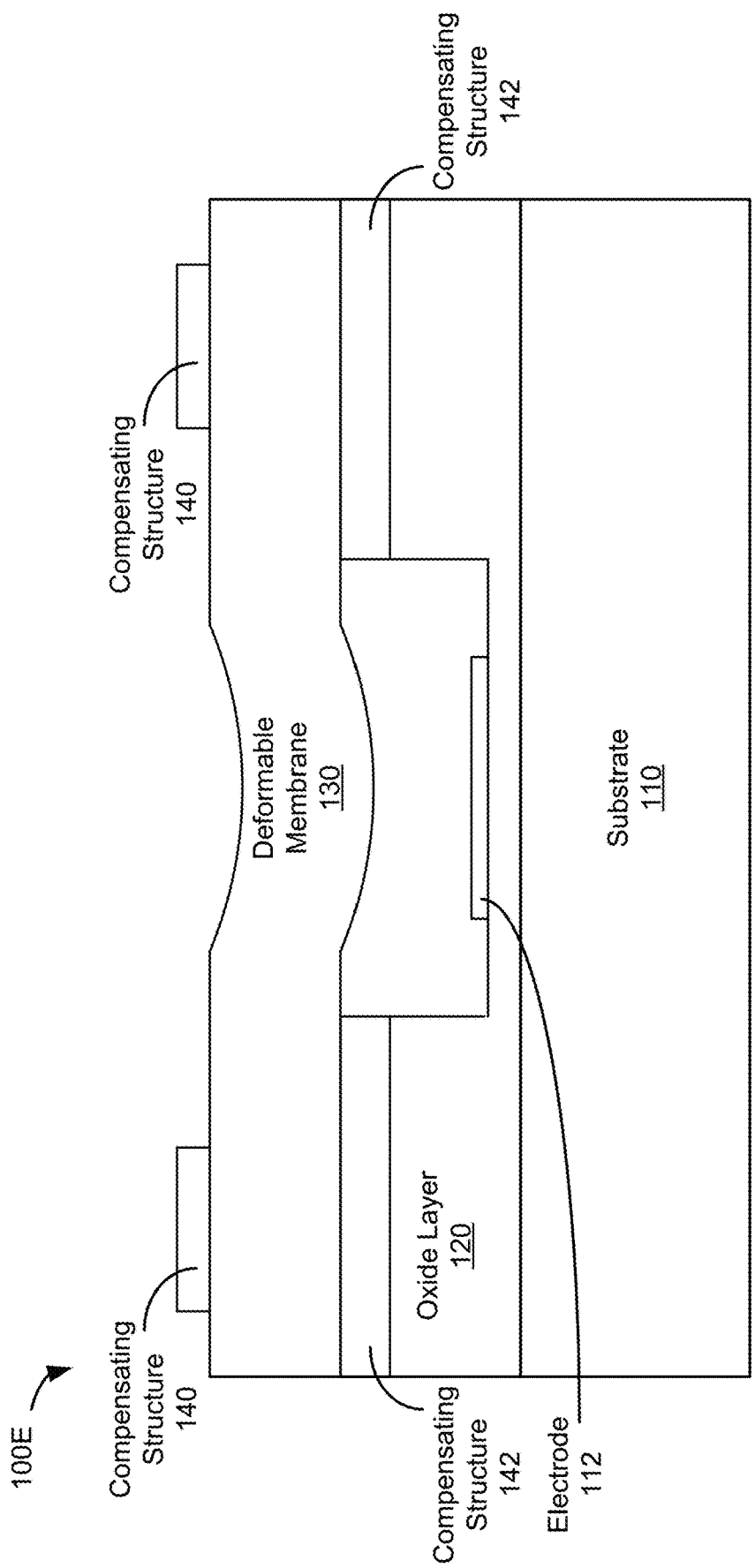
Figure 1F:
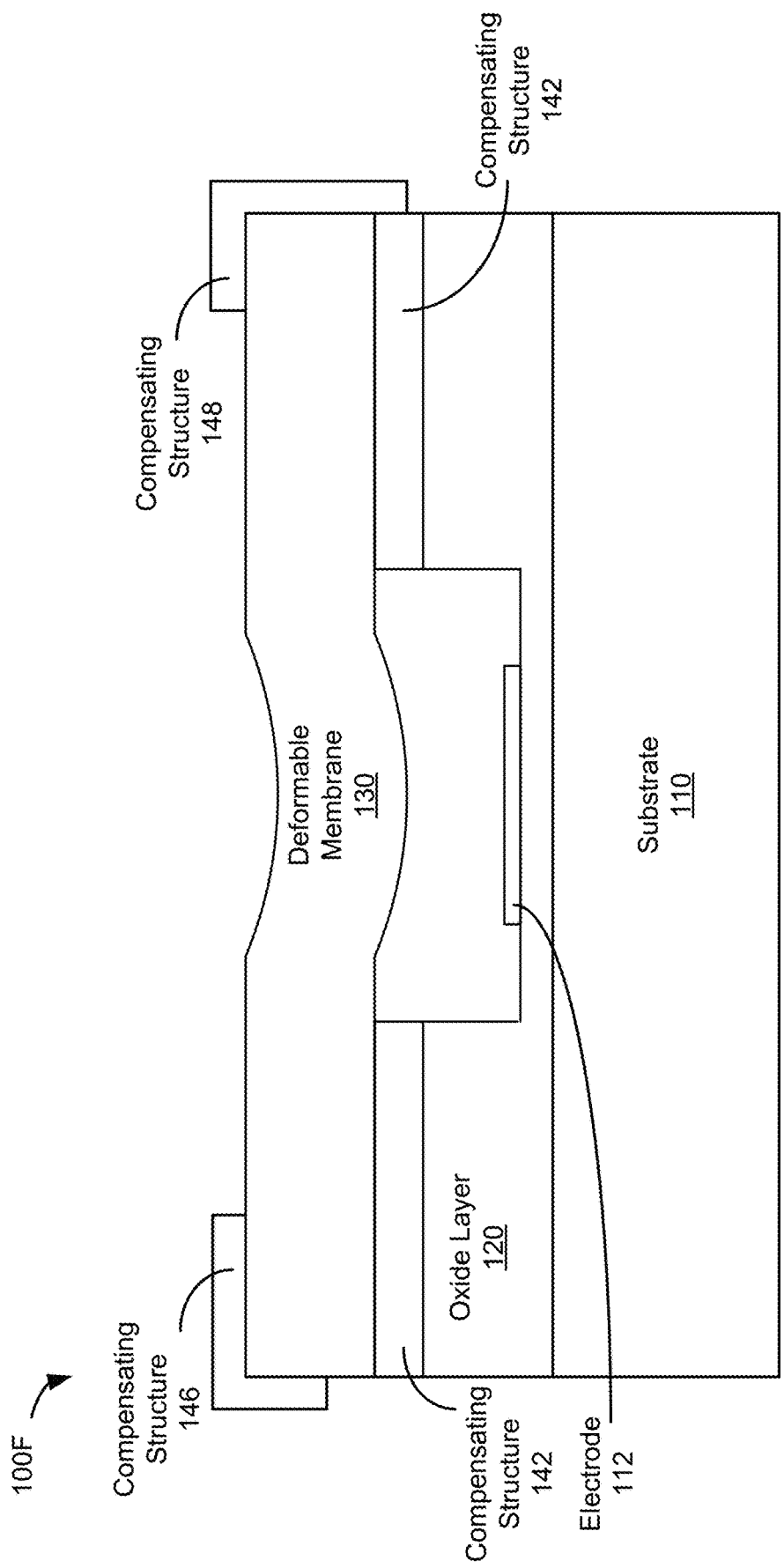
Figure 1G:
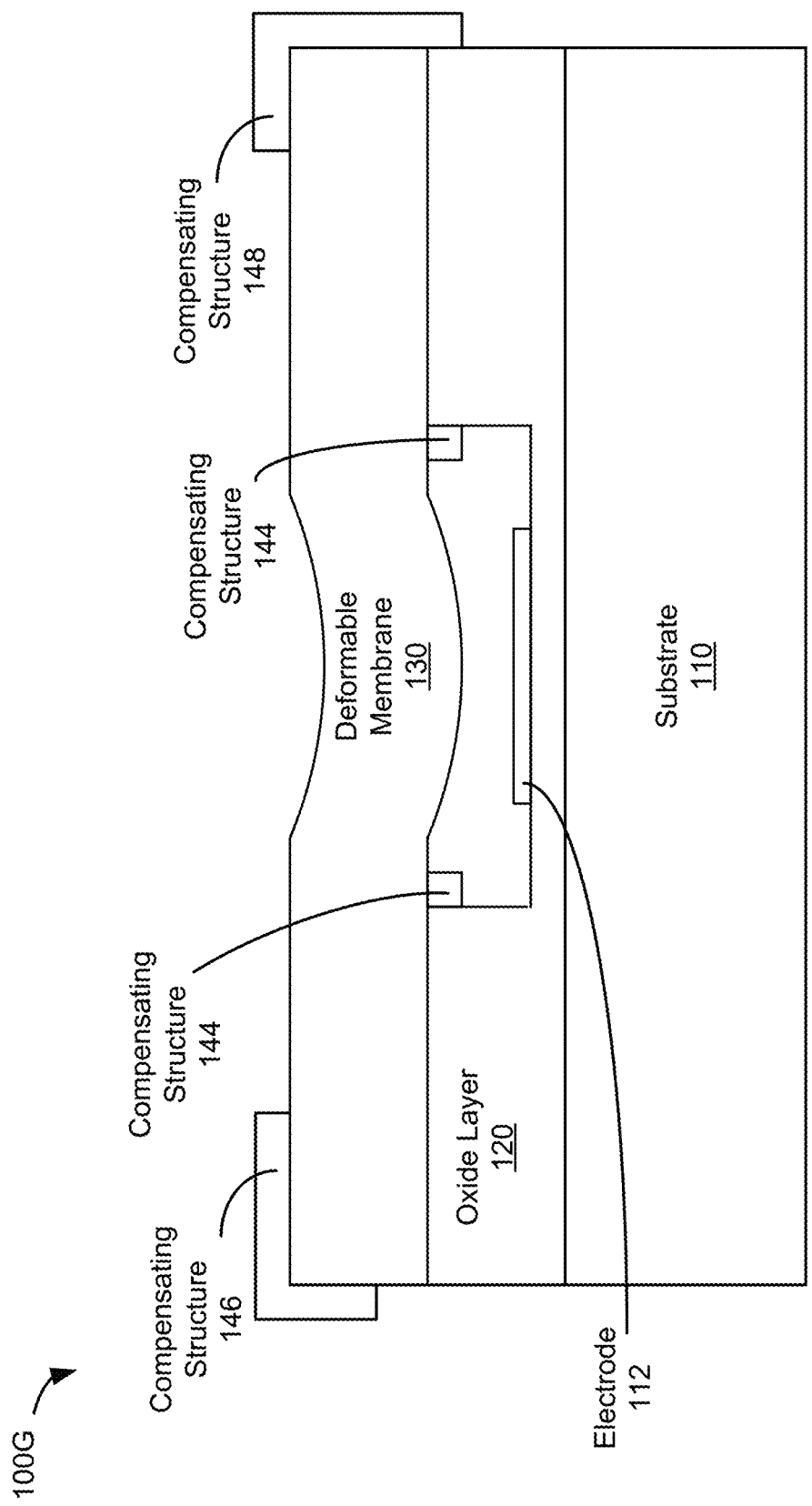
Figure 1H:
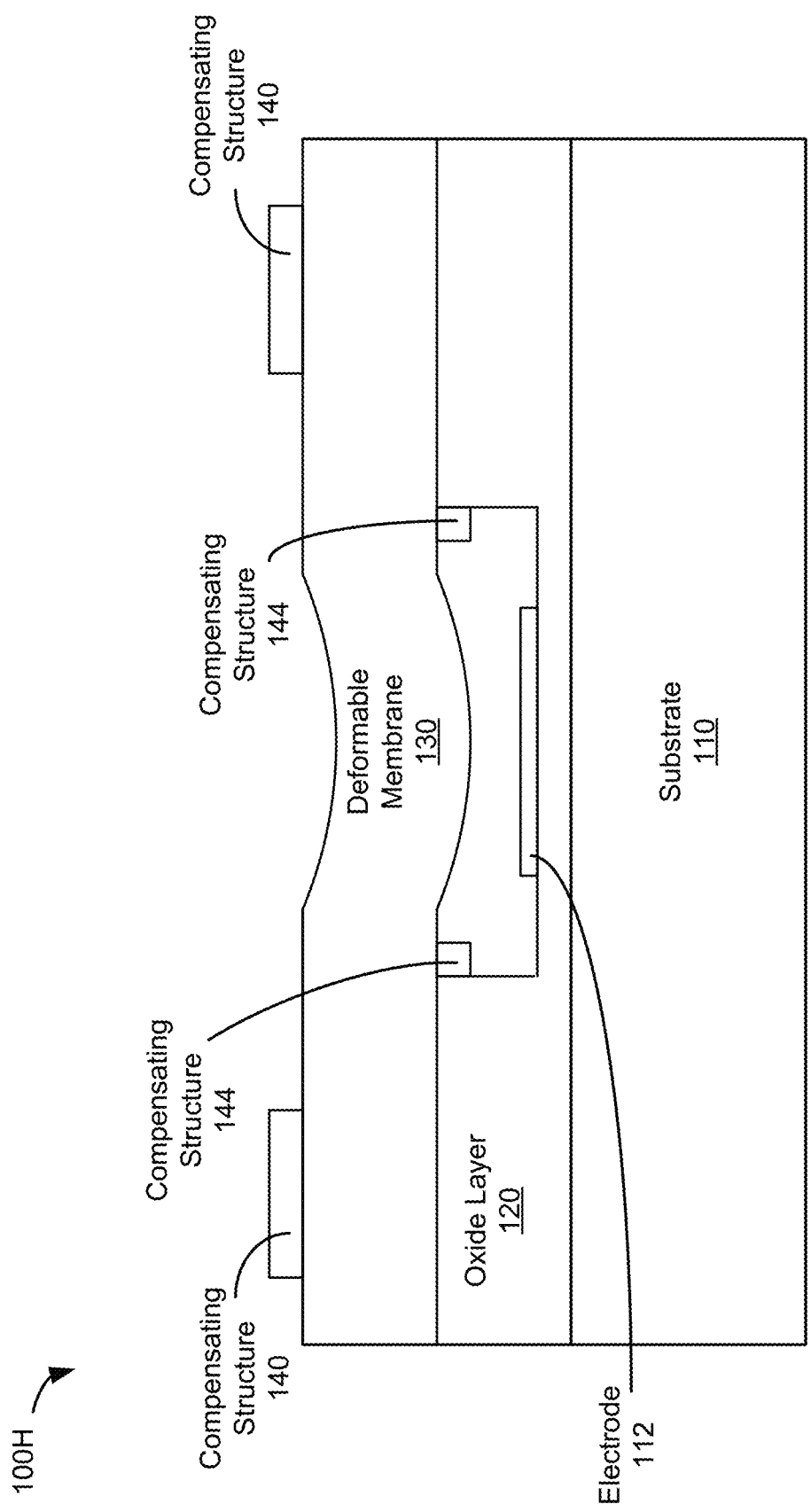

Referring now to FIG. 1E, a sensor 100E according to some embodiments is shown. The sensor 100E combines the embodiments described in FIGS. 1A and 1B. Referring now to FIG. 1F, a sensor 100F according to some embodiments is shown. The sensor 100F combines the embodiments described in FIGS. 1B and 1D. Referring now to FIG. 1G, a sensor 100G according to some embodiments is shown. The sensor 100G combines the embodiments described in FIGS. 1C and 1D. Referring now to FIG. 1H, a sensor 100H according to some embodiments is shown. The sensor 100H combines the embodiments described in FIGS. 1A and 1C.

It is appreciated that the embodiments as discussed are for illustrative purposes only and should not be construed as limiting the scope of the embodiments. In other words, the compensating structure 140 may be formed anywhere in the sensor and it may take any shape, as discussed above.

Figure 2B:
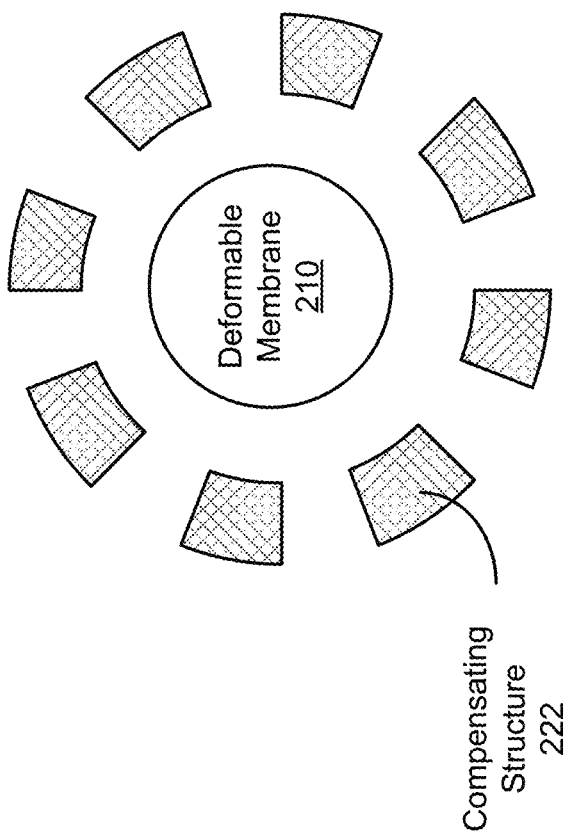
FIG. 2A-2F show a top view of the deformable membrane and compensating structure according to some embodiments.
Figure 2A:
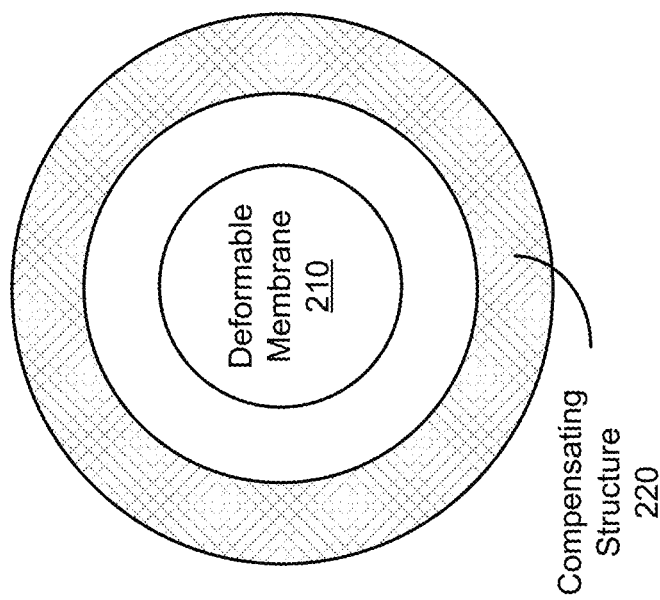
Figure 2D:
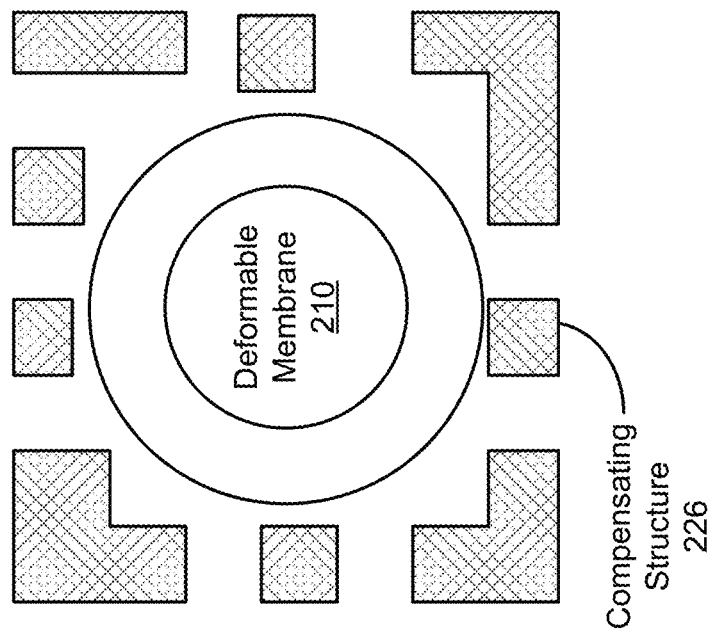
Figure 2C:
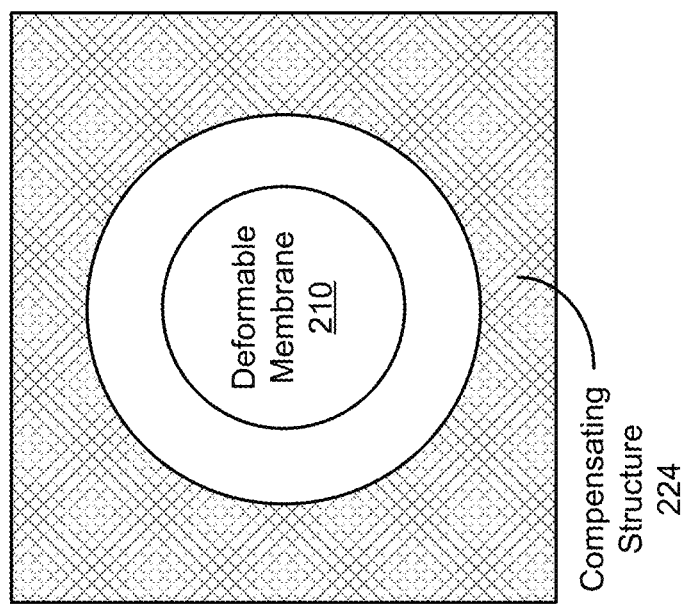

FIG. 2A-2F show a top view of the deformable membrane and compensating structure according to some embodiments. Referring now to FIG. 2A, a top view of a deformable membrane 210 and a compensating structure 220 is shown. It is appreciated that the deformable membrane 210 and the compensating structure 220 may be similar to those described in FIGS. 1A-1H. The compensating structure 220 may be ring shaped and be positioned on the deformable membrane 210, e.g., outer periphery of the deformable membrane 210 in one example. Referring now to FIG. 2B, the top view of the compensating structure 222 is shown. The compensating structure 222 may be ring shaped and it may have gaps therein. The compensating structure 222 may be positioned on the deformable membrane 210, e.g., on an outer periphery of the deformable membrane 210. Referring now to FIG. 2C, a compensating structure 224 is shown. The compensating structure 224 may be square shaped and positioned on the deformable membrane 210, e.g., on the outer periphery of the deformable membrane 210 in one example. Referring now to FIG. 2D, a compensating structure 226 that is square shaped with gaps therein is shown. The compensating structure 226 is positioned on the deformable membrane 210, e.g., the outer periphery of the deformable membrane 210.

Figure 2F:
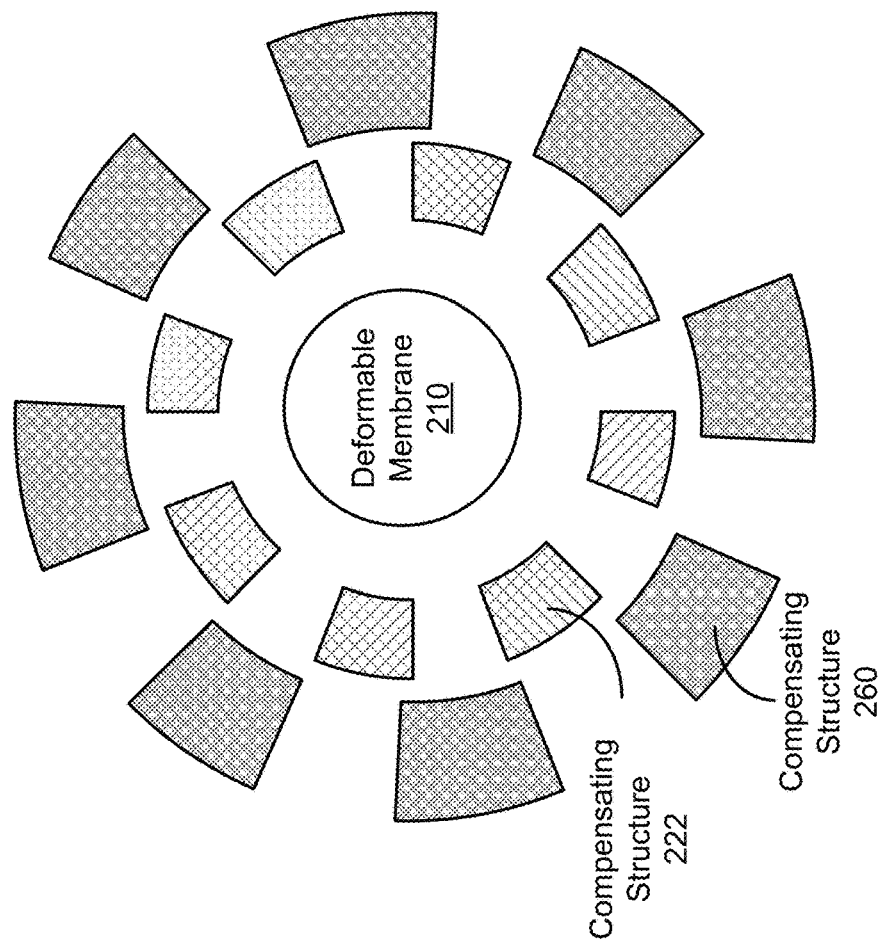
Figure 2E:
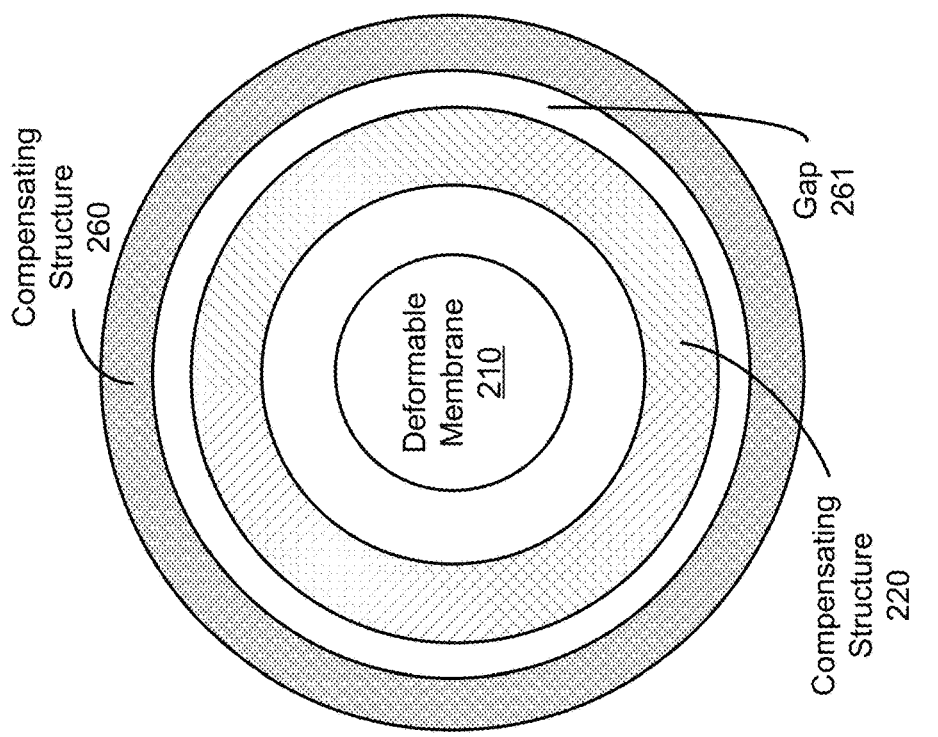

Referring now to FIG. 2E, two compensating structures 220 and 260 according to some embodiments are illustrated. The compensating structure 260 may be an outer compensating structure 260 and the compensating structure 220 may be an inner compensating structure that are positioned on the deformable membrane 210. In some embodiments, the compensating structures 220 and 260 are positioned on the outer periphery of the deformable membrane 210. In some embodiments, the compensating structure 220 may be formed from a material that is different from the compensating structure 260. The compensating structures 220 and 260 may include material such as aluminum, copper, dielectric, polysilicon, Ti, Tungsten, Platinum, molybdenum, silicon, nitride, etc. It is appreciated that a gap 261 may be formed between the two compensating structures 220 and 260.

Referring now to FIG. 2F, two compensating structures 222 and 260 according to some embodiments are illustrated with gaps therein. The compensating structure 260 may be an outer compensating structure 260 and the compensating structure 222 may be an inner compensating structure that are positioned on the deformable membrane 210. In some embodiments, the compensating structures 222 and 260 are positioned on the outer periphery of the deformable membrane 210 and each compensating structure may include gaps therein. In some embodiments, the compensating structure 222 may be formed from a material that is different from the compensating structure 260. The compensating structures 222 and 260 may include material such as aluminum, copper, dielectric, polysilicon, Ti, Tungsten, Platinum, molybdenum, silicon, nitride, etc. It is appreciated that the compensating structure 222 and 260 may be misaligned such that one compensating structure is aligned with gaps of another compensating structure. For example, compensating structure 260 may be aligned with gaps of the compensating structure 222 and vice versa.

Referring now to FIGS. 3A-3G manufacturing a MEMS device according to some embodiments is shown. It is appreciated that while the embodiment is described with respect to a pressure sensor, the embodiments should not be construed as limiting the scope. For example, the embodiment is equally applicable to a gyro, accelerometer, etc.

Figure 3A:
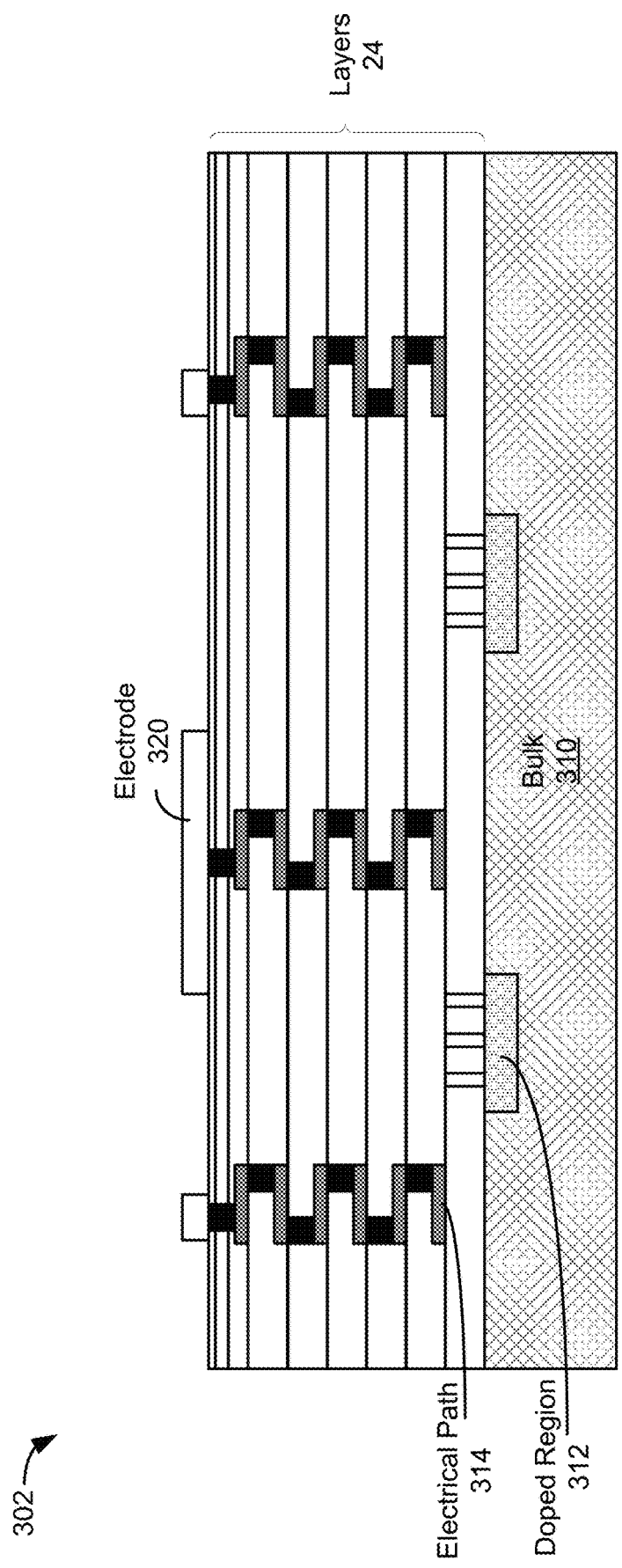
FIGS. 3A-3G show manufacturing a MEMS device according to some embodiments.

Referring specifically to FIG. 3A, the sensor includes a substrate 302 may be a semiconductor substrate, e.g., a silicon substrate. The substrate 302 has a first side and a second side. The substrate 302 contains a bulk material 310 of, e.g., silicon and a stack of layers 24 on the bulk material 310, on its second side. These layers 24 may be arranged for CMOS processing of the substrate 302, and as such may also be denoted as CMOS layers or material layers. Specifically, the layers 24 can include for example a plurality of $SiO_2$ layers, metal or polysilicon layers. The bulk material 310 may contain doped regions within the silicon such as indicated by the reference sign 312. These components can form active circuitry, such as amplifiers, A/D converters or other analog and/or digital signal processing units. A top layer of the stack of layers 24 may be a dielectric layer of silicon oxide and/or silicon nitride protecting the structures below it. In the present example, a processing circuit may be formed in the doped regions 312 of the substrate 302 by means of CMOS processing. The layers 24 may include one or more electrical paths 314 for electrically connecting the first side of the substrate 302 to its second side. A metal layer 320 may be formed on the top layer of the stack of layers 24 and it may be used as an electrode.

Figure 3B:
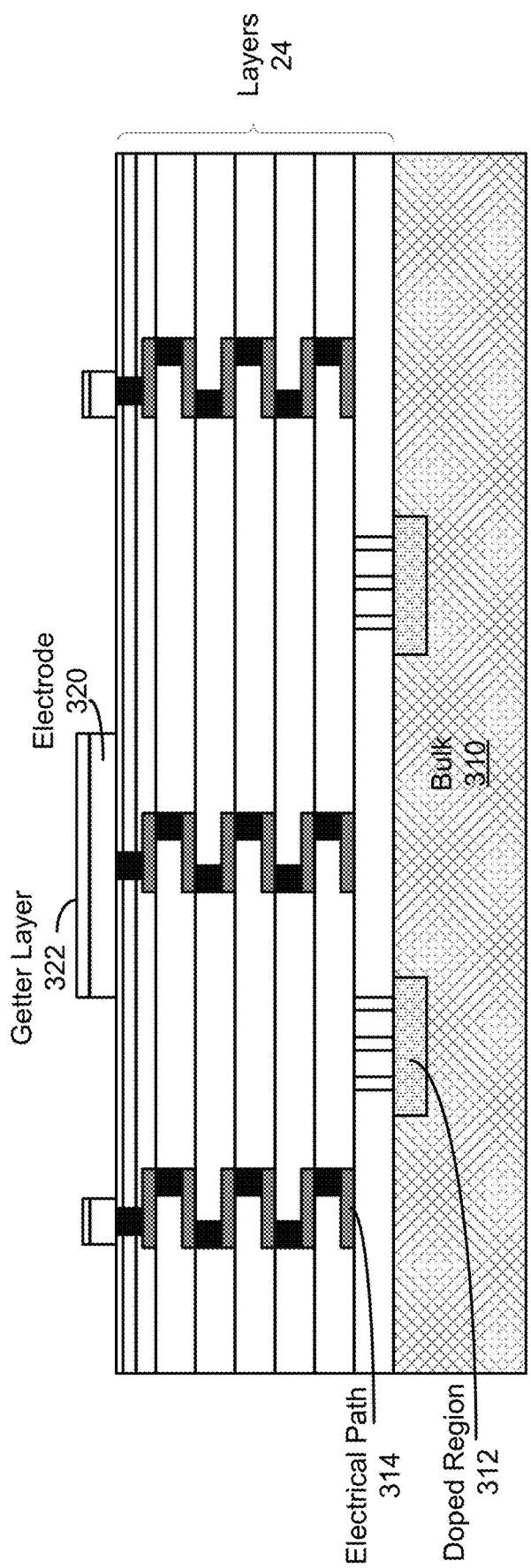

Referring now to FIG. 3B, an optional embodiment of a sensor is illustrated. In some embodiments, the top of the electrode 320 and/or the top of the electrical paths 314 may be coated with a getter layer 322, e.g., Ti.

Figure 3C:
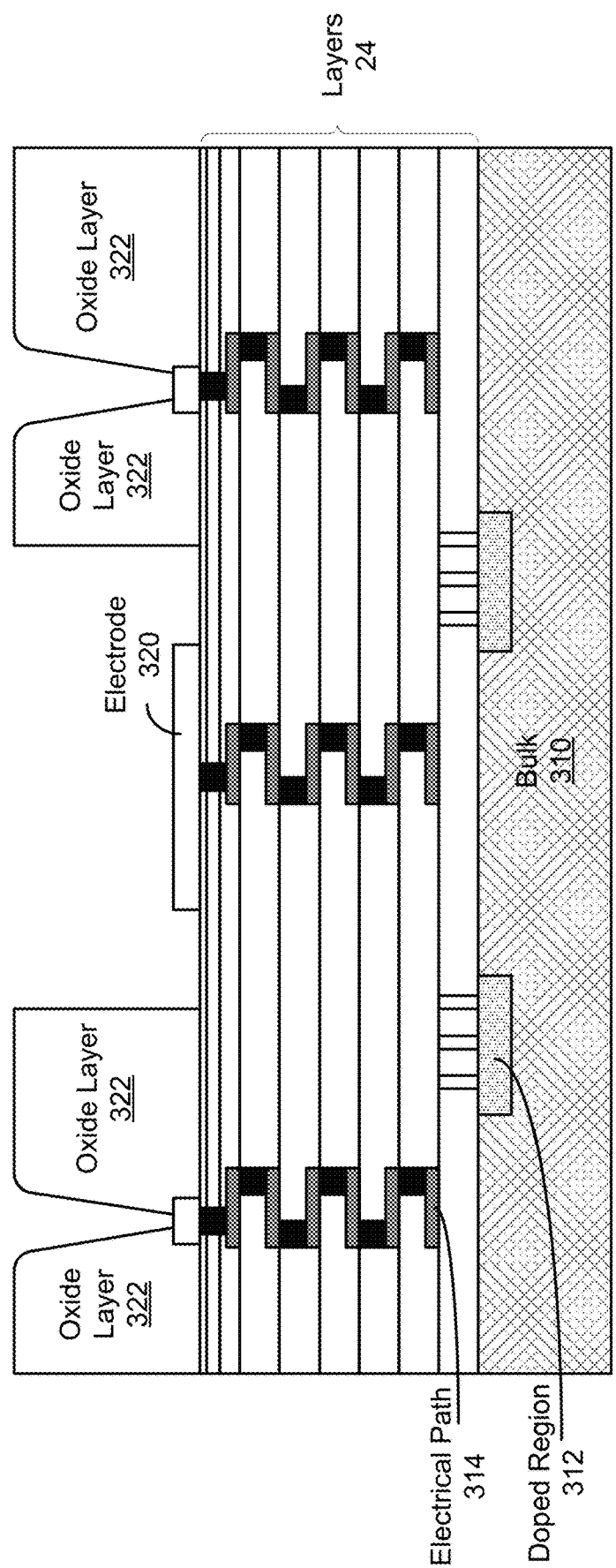
Figure 3D:
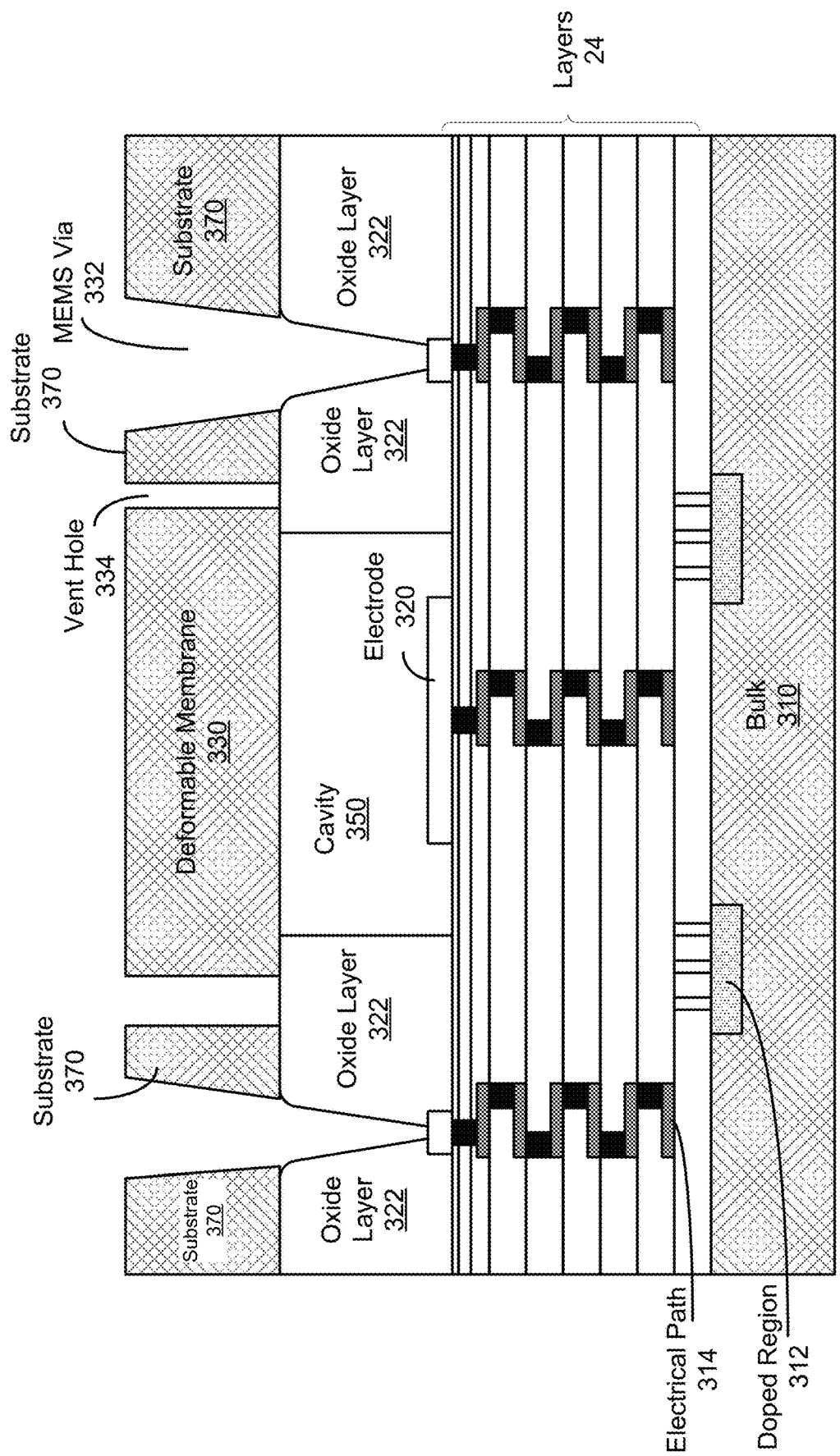

Referring now to FIG. 3C, an oxide layer 322, e.g., $SiO_2$, may be deposited over layers 24, electrode 320, etc. In some embodiments, the oxide layer 322 is etched to form a pattern (as shown). Referring now to FIG. 3D, a substrate 370 and a deformable membrane 330 is coupled to the oxide layer 322. It is appreciated that in some embodiments the substrate 370 and the deformable membrane 330 are one substrate that is etched to form the substrates 370 and the deformable membrane 330. The substrate 370 and the deformable membrane 330 may be a remainder of an SOI substrate.

Accordingly, MEMS via 332 and vent hole 334 are formed. The deformable membrane 330 forms a cavity 350 in conjunction with the oxide layers 322, the electrode 320, and the top layer of the layer stack 24. In some embodiments, the cavity 350 is formed by omitting or removing material from one or more of the layers 24. The cavity 350 is closed by a deformable membrane 330. The deformable membrane 330 is sufficiently thin such that it deforms depending on external stimuli, e.g., pressure. The electrode 320 may be used as an electrode and may be arranged at the bottom of the cavity 350. The deformable membrane 330 may be formed by a doped, conducting silicon layer, arranged as a sealing lid over the cavity 350, and may be used as another electrode for which reason the deformable membrane 330 may contain electrically conducting material. Hence, upon a change in pressure the deformable membrane 330 deflects and as such a distance between the two electrodes changes which results in a change of the capacitance between the two electrodes.

Figure 3E:
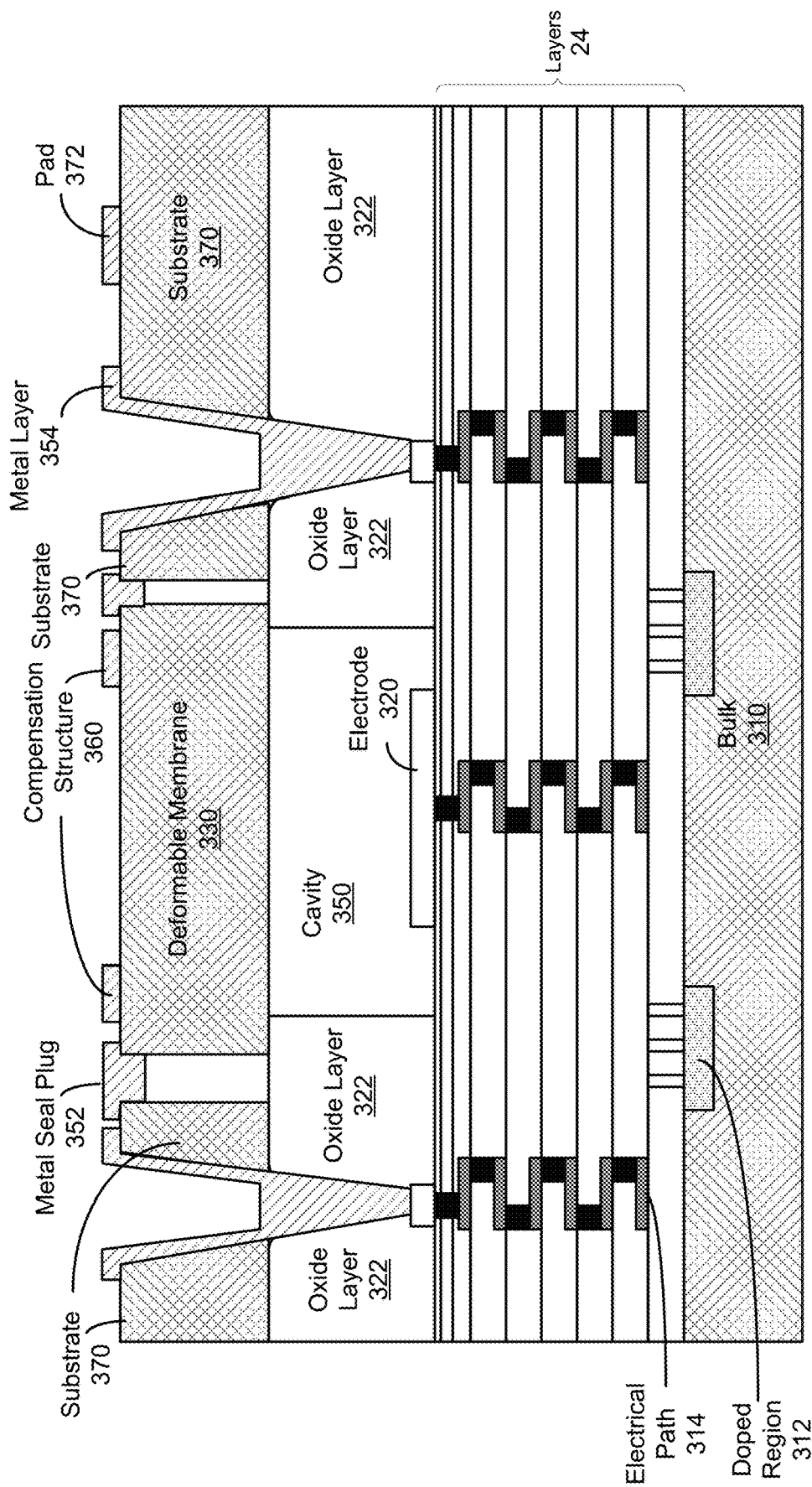

Referring now to FIG. 3E, a metal layer 354, e.g., aluminum, copper, TiN, AlCu, etc., is formed over the MEMS via 332 and the substrate 370. It is appreciated that in some embodiments a metal plug 352, e.g., aluminum, copper, TiN, AlCu, etc., may be formed over the vent holes 334 covering also a portion of the deformable membrane 330 and the substrate 370. A metal pad 372, e.g., aluminum, copper, TiN, AlCu, etc., may also be formed over the substrate 370 to connect to other electrical components, e.g., external to the sensor. It is appreciated that prior to sealing using the metal plug 352, the cavity may be vacuumed and exhaust residual gas is exhausted before sealing with the metal plug 352. It is appreciated that a compensation structure 360 may also be formed over the deformable membrane 330. In some embodiments, the compensation structure 360 may include material such as aluminum, copper, dielectric, polysilicon, Ti, Tungsten, Platinum, molybdenum, silicon, nitride, etc.

Figure 3F:
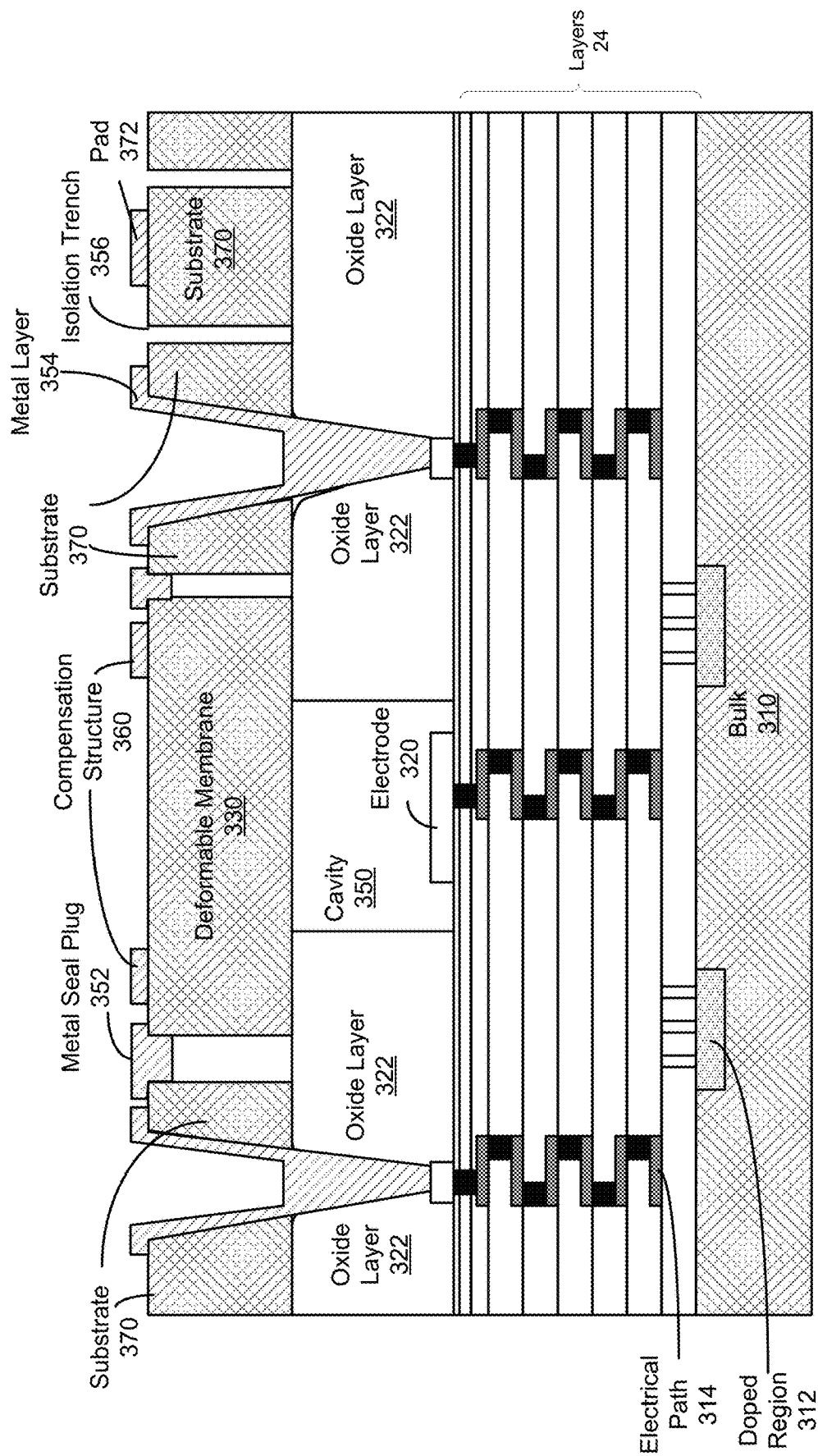
Figure 3G:
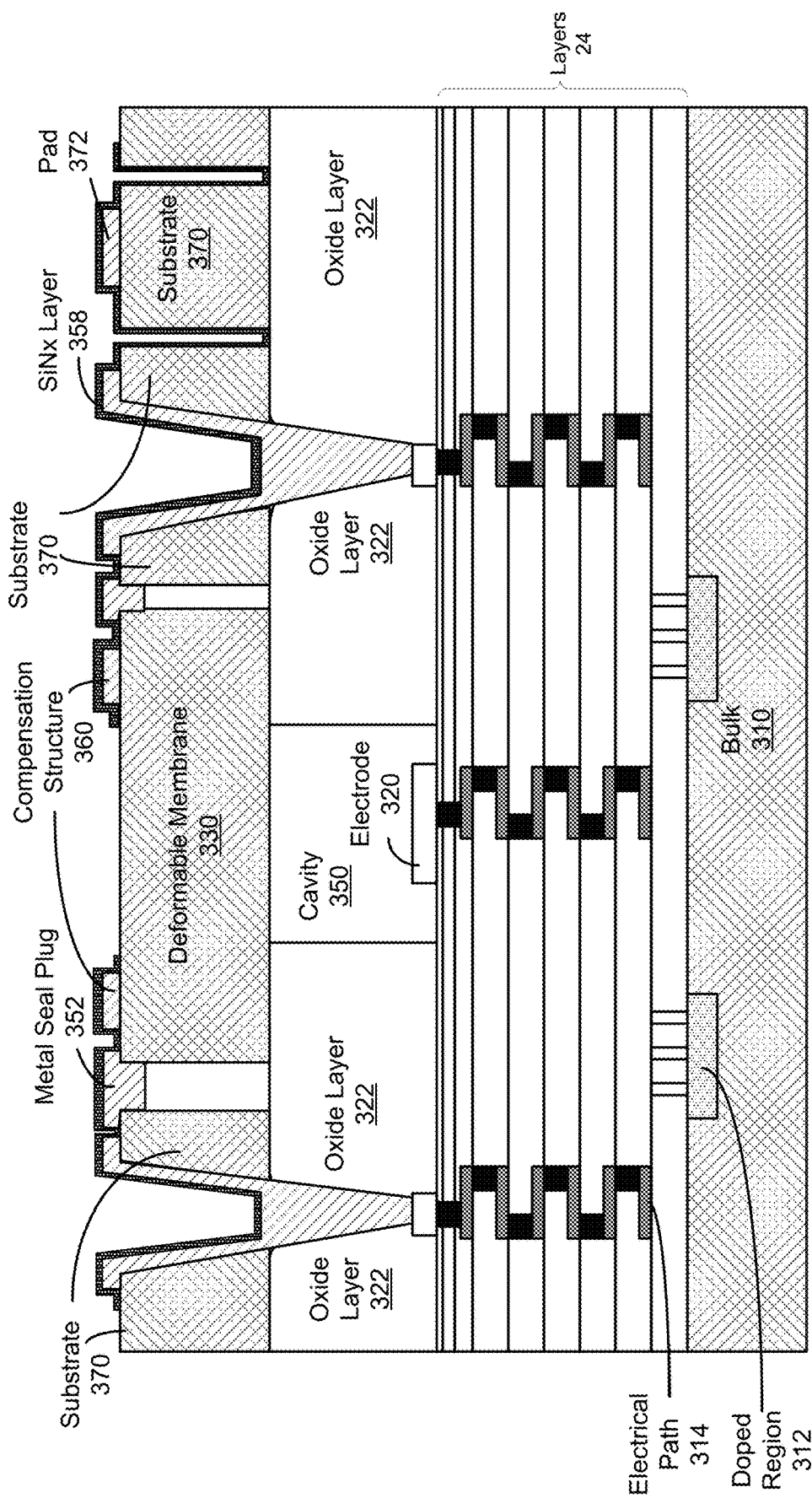

Referring now to FIG. 3F, isolation trenches 356 are optionally formed in the substrate 370. Isolation trenches may be formed to provide electrical separation of the deformable membrane and wire bonding pads. Referring now to FIG. 3G, a layer of SiNx may be deposited on the isolation trench 356, the substrate 370, the pad 372, the metal seal plug 352, the compensation structure 360 and a portion of the deformable membrane 330 in order to reduce gas leakage.

It is appreciated that signals may be transmitted from the electrodes, i.e. the deformable membrane 330 and the electrode 320 via electrical paths 314 to the processing circuit 312 where these signals are processed.

It is appreciated that even though it is not shown, another substrate, e.g., silicon substrate, may be coupled to the shown sensor. The substrate may include vias to provide electrical connection between the sensor and an external circuitry. For example, electrical connection may be provided to the outside world may also be implemented via one or more of a Land Grid Array, a Pin Grid Array, or a leadframe.

Figure 4:
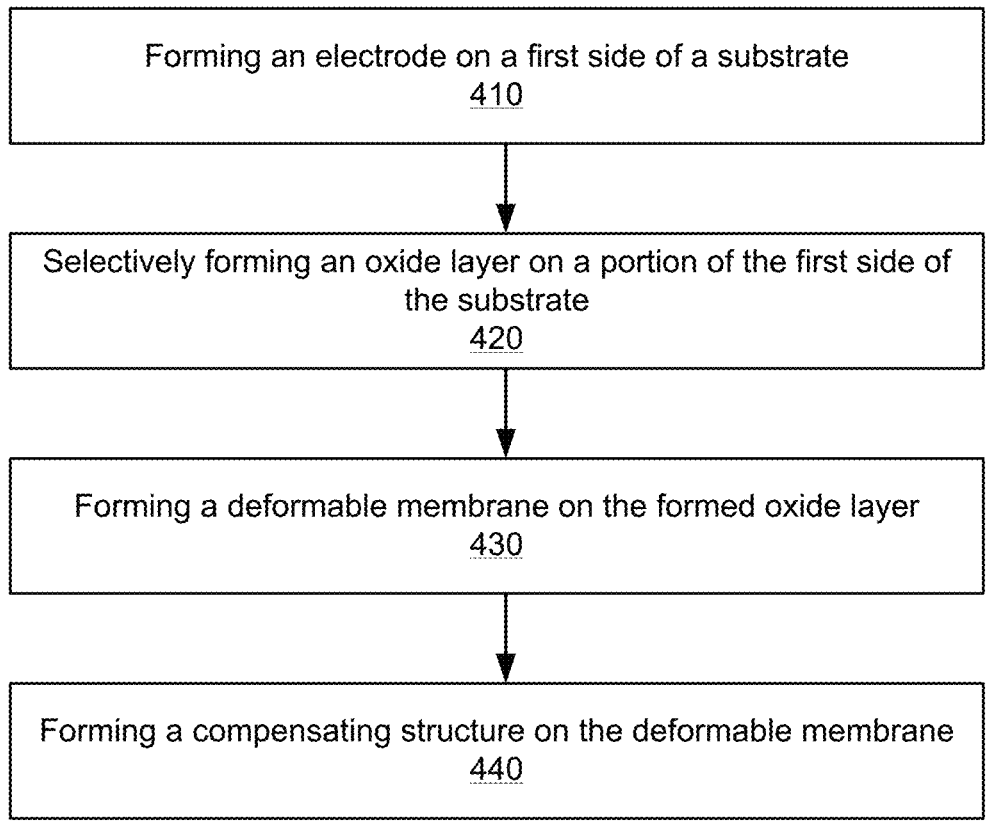
FIG. 4 shows an example of flow diagram for manufacturing a MEMS device according to some embodiments.

FIG. 4 shows an example of flow diagram for manufacturing a MEMS device according to some embodiments. At step 410 an electrode is formed on a first side of a substrate, as illustrated above. The substrate includes a second side that is opposite to the first side. At step 420, an oxide layer is selectively formed on the first side of the substrate. At step 430, a deformable membrane is formed on the oxide layer, as illustrated in FIGS. 1A-3G. The deformable membrane and the formed oxide layer form a cavity therein. The deformable membrane deforms in response to external stimuli. It is appreciated that the cavity may be formed by etching the substrate and then forming the deformable membrane over the cavity in order to enclose it. At step 440, the compensating structure is formed on the deformable membrane, as illustrated in FIGS. 1A-3G. The compensation structure creates a bending force that is opposite to a bending force of the deformable membrane responsive to temperature changes and thermal coefficient mismatch. In some embodiments, the bending force created by the compensating structure is equal in value to the bending force of the deformable membrane. The compensation structure may include material such as aluminum, copper, dielectric, polysilicon, Ti, Tungsten, Platinum, molybdenum, silicon, nitride, etc. It is appreciated that in some optional embodiments, an electrode may be formed on or within the deformable membrane. It is also appreciated that in some embodiments, the compensating structure may be connected to the oxide layer.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A sensor comprising:
   a substrate;
   an oxide layer disposed on the substrate;
   a deformable membrane disposed on the oxide layer, wherein the deformable membrane, the oxide layer, and the substrate forms an enclosed cavity therein, wherein the deformable membrane deforms responsive to stimuli, and wherein the oxide layer forms side walls of the enclosed cavity;
   an electrode positioned at a bottom of the cavity; and
   a compensation structure connected to the deformable membrane, wherein the compensation structure creates a compensation force that is opposite to a bending force of the deformable membrane responsive to temperature changes and thermal coefficient mismatch.

2. The sensor as described in claim 1, wherein the compensation structure is connected to the substrate.

3. The sensor as described in claim 1, wherein the compensation structure is disposed over the oxide layer.

4. The sensor as described in claim 1, wherein the compensating structure is connected to an outer periphery of the deformable membrane.

5. The sensor as described in claim 1, wherein the compensating structure is disposed on the deformable membrane.

6. The sensor as described in claim 1, wherein the compensation structure is positioned between the deformable membrane and the substrate.

7. The sensor as described in claim 1, wherein the compensation structure is ring shaped.

8. The sensor as described in claim 1, wherein the compensation structure comprises a plurality of rings.

9. The sensor as described in claim 8, wherein the plurality of rings have a gap in between.

10. The sensor as described in claim 1, wherein the compensation structure is selected from a group consisting of aluminum, copper, dielectric, polysilicon, Ti, Tungsten, Platinum, molybdenum, silicon, and nitride.

11. A sensor comprising:
    a substrate comprising a cavity therein;
    an electrode positioned at a bottom of the cavity of the substrate;
    a deformable membrane positioned on the substrate, wherein the deformable membrane encloses the cavity, wherein the deformable membrane deforms responsive to external stimuli; and
    a compensation structure coupled to the deformable membrane, wherein the compensation structure and the deformable membrane are on different planes, and wherein the compensation structure creates a compensation force that is opposite to a bending force of the deformable membrane responsive to temperature changes and thermal coefficient mismatch.

12. The sensor as described in claim 11, wherein the compensation structure is connected to the deformable membrane and the substrate.

13. The sensor as described in claim 12, wherein the compensation structure is connected to an oxide layer of the substrate.

14. The sensor as described in claim 11, wherein the compensation structure is positioned between the deformable membrane and the substrate.

15. The sensor as described in claim 11, wherein the compensation structure is ring shaped.

16. The sensor as described in claim 11, wherein the compensation structure is selected from a group consisting of aluminum, copper, dielectric, polysilicon, Ti, Tungsten, Platinum, molybdenum, silicon, and nitride.

17. A method comprising:
    forming an electrode on a substrate;
    selectively forming an oxide layer on a portion of the substrate;
    forming a deformable membrane on the formed oxide layer, wherein the deformable membrane and the formed oxide layer forms a sealed cavity therein, wherein the deformable membrane deforms responsive to external stimuli; and
    forming a compensation structure on the deformable membrane, wherein the compensation structure creates a compensation force that is opposite to a bending force of the deformable membrane responsive to temperature changes and thermal coefficient mismatch.

18. The method as described in claim 17, wherein the compensation structure is selected from a group consisting of aluminum, copper, dielectric, polysilicon, Ti, Tungsten, Platinum, molybdenum, silicon, and nitride.

19. The method as described in claim 17 further comprising:
    forming another electrode on the deformable membrane.

20. The method as described in claim 17, wherein the compensation structure is connected to the oxide layer.

21. The sensor as described in claim 1, wherein the compensation structure is disposed within the enclosed cavity.

22. The sensor as described in claim 1, wherein the compensation structure is continuous.

23. The sensor as described in claim 1, wherein the compensation structure has a gap therebetween.

24. The sensor as described in claim 1, wherein the compensation structure is formed on an outer periphery of the deformable membrane.

25. The sensor as described in claim 1, wherein the deformable membrane is in physical contact with the oxide layer.

26. The sensor as described in claim 11, wherein the deformable membrane is in physical contact with the oxide layer.

27. The method as described in claim 17, wherein the deformable membrane is in physical contact with the oxide layer.

\* \* \* \* \*